United States Patent [19]

Mayhew

[11] Patent Number: 4,568,841

[45] Date of Patent: Feb. 4, 1986

[54] FLEXIBLE TIMING CIRCUIT

[75] Inventor: Steven C. Mayhew, Nashua, N.H.

[73] Assignee: Digital Equipment Corporation, Maynard, Mass.

[21] Appl. No.: 479,632

[22] Filed: Mar. 28, 1983

[51] Int. Cl.⁴ .......................................... H03K 3/027
[52] U.S. Cl. .................................... 307/265; 307/269;
    307/480; 307/601; 307/602; 328/58; 328/61;
                                                377/107
[58] Field of Search ............... 307/265, 273, 590, 600,
    307/601, 602, 605, 603, 608, 607, 269, 480;
        377/73, 75, 107, 110, 114, 39, 56, 52, 109;
                                            328/61, 58

[56] References Cited

U.S. PATENT DOCUMENTS

| | | | |
|---|---|---|---|
| 2,519,184 | 4/1946 | Grosdoff | 377/107 |
| 3,258,696 | 9/1963 | Heymann | 377/75 |
| 3,267,381 | 10/1963 | Thornberg et al. | 377/114 |
| 4,282,488 | 8/1981 | Norman et al. | 307/608 |

Primary Examiner—John S. Heyman
Assistant Examiner—D. R. Hudspeth
Attorney, Agent, or Firm—William E. Cleaver

[57] ABSTRACT

The present invention includes a counter device which counts pulses from a pulse source and provides the basis for a control gate signal. Logic circuitry is connected to the counter device and through said logic circuitry there are provided the leading edge, the interim voltage level signal, and the trailing edge of said control gate signal. The counter device is connected from at least two latter stages to said logic circuitry to provide two possible trailing edges, which in turn selectively define two different length gate signals. Said logic circuitry is further connected to address signal circuitry and in response to a first address provides a control gate signal of a first length and in response to a second address provides a control gate signal of a second length.

10 Claims, 2 Drawing Figures

FLEXIBLE TIMING CIRCUIT

BACKGROUND

In electronic data processing (EDP) systems, including data communications systems, the data signals and the address signals are transmitted (or clocked) through the circuitry in accordance with signals from a clock signal generator. In other words, some timing standard is provided to insure the system that signals passing therethrough will pass through the logic circuitry, i.e., AND gates, NAND gates, OR gates, NOR gates, and into and out of RAMS, etc. without being "out of step," for instance, without being present at a circuit before or after a necessary control signal arrives. While electronic data processing systems are identified as synchronous systems or asynchronous systems, both types of systems operate to be in step with a basic clock signal. In a synchronous system, machine cycles in which the system accomplishes some program step, or the like, are uniform. Such an arrangement can be preferable in that normally less hardware is required than is required in an asynchronous system because the data flow in a synchronous system is designed to operate within a uniform cycle. In other words, a synchronous system is not burdened with the hardware which is necessary to handle a number of options. However, such a synchronous system can be burdensome if the user is desirous of taking advantage of high speeds and the speed of accessing the information, or the speed of data transmission, varies from one component used in the system to another component used in the system. Asynchronous systems are better able to take advantage of varying response times. The present invention takes advantage of working with a synchronous system (therefore the advantage of working with a lesser amount of hardware) but provides a means for varying the cycle time to accommodate the fact that certain components function faster, or not so fast, as certain other components used in the system.

SUMMARY

The present invention employs some form of counting means to count the pulses from a pulse source such as a crystal controlled oscillator. Control gate signals are obtained from the output terminals of selected stages of the counting means. In other words, the output signal from the first and the seventh stage can provide a gate signal which has a timing width of six clock pulses. If output terminals of other stages were selected, the system could provide gate signals having widths of other number of clock pulses. The output signals from the counter means are coupled to logic circuity which is further coupled to address signal circuitry. In the exemplary embodiment, the address signal circuit provides two different address signals. In response to one of the address signals, the logic circuitry employs the output from a particular stage of the counter to provide a particular trailing edge of the gate signal which defines a relatively short stage signal. In response to said other address signal, the logic circuitry selects the output of a different stage of the counter to provide a different trailing edge of the gate signal which defines a relatively long gate signal. Because of the foregoing arrangement, if a component responds relatively slowly, the address signals for that component include said second address signal while if a component responds relatively quickly, the address signals for that component include said first address signal. In this way the present system can accommodate varying response speeds as does an asynchronous system and yet operates within a synchronous system.

The objects and features of the present invention can be better understood and appreciated in view of the following description taken in conjunction with the drawings in which.

Figure 1:
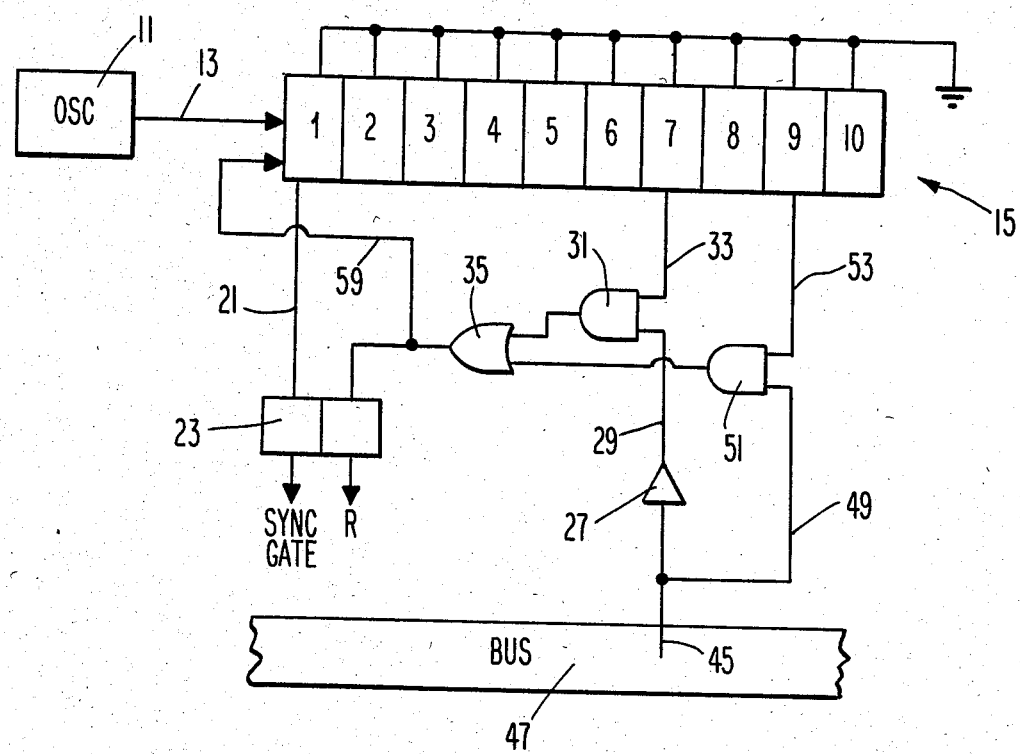
FIG. 1 is a block diagram schematic of the present circuit.
Figure 2:
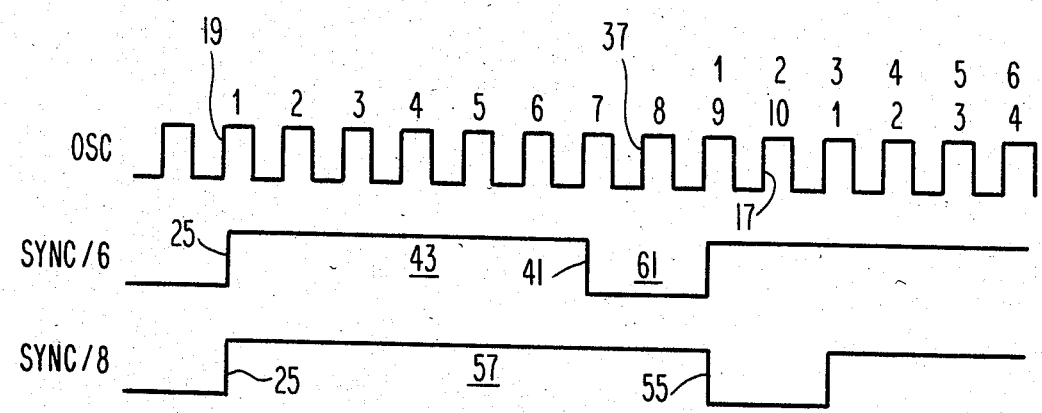
FIG. 2 is a timing diagram of signals passing through the circuitry of FIG. 1.

Examine FIG. 1 wherein there is shown an oscillator 11. The oscillator 11 can be any well known pulse source such as a crystal controlled oscillator and in the exemplary embodiment, the oscillator 11 provides the pulse such as shown in FIG. 2 opposite the identification OSC. In the exemplary embodiment, the pulses shown in FIG. 2, opposite OSC, are ten microseconds in width. Pulses of other time widths could be used. As can be seen in FIG. 1, the oscillator 11 provides the pulses on line 13 to the counter device 15. The counter device 15 can be any well known counter device which has a plurality of stages and in the exemplary embodiment is part number 74161 manufactured by Signeties Corporation and others. As can be seen in FIG. 1, the counter device 15 has ten stages. It should be understood that the counter device 15 could have more than ten stages or less than ten stages depending upon the length of the control gate signals that are to be generated.

As can be gleaned from an examination of FIG. 1, there is an output line from stage one to flip-flop 23. Accordingly, when the leading edge 19 (FIG. 2) of the first pulse is received by the first stage of the counter 15, that stage in turn provides a leading edge pulse on the line 21, to transfer the flip-flop 23 to its set side. When the flip-flop 23 is transferred to its set side, it provides a leading edge 25 for the SYNC gate as can be seen in FIG. 2.

If the component that is being addressed, that is, the electronic circuitry which is being asked to send information, is in fact a relatively fast responsive device, then the system will want to generate a relatively short synchronous signal or a relatively short machine cycle time. In the exemplary embodiment, in such a situation, the address signals for the component would include one bit signal, which would be a low bit signal and hence the inverter 27 would provide a high signal on line 29 to AND gate 31. Accordingly, AND gate 31 is partially conditioned and awaits a high signal on line 33. When the counter device 15 is advanced to the seventh stage, the output signal from the seventh stage on line 33 fully conditions the AND gate 31 to provide an output signal through the OR gate 35 along the line 39 to reset the flip-flop 23 and thus provide the trailing edge 41 for the SYNC pulse 43. As can be determined by an examination of FIG. 2, the SYNC gate, or the control gate 43, extends for a sufficient length of time to include six clock pulses. In other words, the control gate 43 is a six clock pulse width control gate signal. Since the system responds to leading edges of the oscillator pulses and since there is a delay between the leading edge 19 and the transfer of flip-flop 23, the leading edge 25 falls within the first pulse and the trailing edge 41 falls within the seventh pulse, as can be seen in FIG. 2. If, in fact, a six pulse cycle were to be repeated, the ninth pulse would in fact be the first pulse of the second cycle because of the two pulse dead time as will be explained hereinafter.

If, on the other hand, the system programmer determined that the component which was to be addressed at some particular time was, in fact, a relatively slow responding component, then the bit address signal on the line 45, from the bus 47, would be a high signal. Such a high signal would pass through the inverter 27 to be a low signal and block AND gate 31. On the other hand, the high signal on line 49 is transmitted to AND gate 51 to partially condition AND gate 51. When the counting devide 15 is advanced to the ninth stage, there is an output signal from the ninth stage on line 53, which fully conditions the AND gate 51 to provide an output signal to the OR gate 35. The output signal from OR gate 35, on line 39, resets the flip-flop 23 to provide the trailing edge 55 of the SYNC/8 signal or the control gate signal 57. By examining FIG. 2, it becomes apparent that the control gate signal 57 is of sufficient width to encompass eight clock pulses.

It should be noted that the output signal from OR gate 35 in also transmitted along the line 59 to the input of counter 15. The signal on line 59 is a synchronous reset signal. On the leading edge of a pulse following a signal on line 59, ZERO's are jammed into every stage of the counter 15 and hence, the counter 15 is reset. From FIG. 2, it can be gleaned that the signal on line 59 is at approximately the same time as edge 41 or edge 55. In the first instance, the ZERO's are jammed into counter 15 at the leading edge 37 of pulse eight, and in the second instance, at the leading edge 17 of pulse ten. Accordingly, irrespective of whether the system is developing the short control gate signal 43 or the long control gate signal 57, when such control signals are to be defined and respond to a signal on line 39, each of the counter stages is reset to be ready for a subsequent cycle time. Between each SYNC gate and the following SYNC gate, there is a dead time 61, which provides time for the EDP system to accomplish certain operations. During the generation of control gate signal 57, when the counter device reaches the seventh stage, the output from the seventh stage on line 33 will be ineffective because the AND gate 31 will not be fully conditioned, as mentioned earlier. Accordingly, the transfer of the flip-flop 23 will have to rely on the output of the AND gate 51 which occurs at the ninth stage and thus the longer control gate signal 57 is defined.

It should be recognized that in the spirit of the invention if there were three or four or more components which needed varying cycle times to accommodate such components, more than one address line could be used in place of line 45. In other words, if there were four varying cycle times to be accommodated and two lines were used for the address signals (to provide the four combinations), then, instead of the inverter 27, there could be a decoder circuit to condition four different AND gates and a longer counter device could be used. It should also be noted that other forms of reset circuits could be used. If counter 15 were a series of flip-flops, a signal on line 59 would transfer all of the flip-flops to their reset sides.

The present circuit is used with a synchronous system and, in the exemplary embodiment, can be thought to operate generally with a six pulse width SYNC gate such as SYNC gate 43. On the occasion that the system is addressing a slower responsive component, the bit signal on line 45 will partially condition AND gate 51 and, at the ninth stage, AND gate 51 will be fully conditioned to provide the longer gate signal such as SYNC signal 57 as explained above.

I claim:

1. A timing circuit to be used with a data communications system to alter the time period of at least one control gate signal from a time period of X to a time period of X+N comprising in combination: repetitive signal source means; start and stop signal generating means for providing a start signal as well as first and second stop signals, each of said stop signals being respectively generated at a different length of time from said start signal, said start and stop signal generating means connected to said repetitive signal source means for operating in response to receiving repetitive signals; address signal generating means for providing at least first and second address signals; logic circuitry connected to said start and stop signal generating means and to said address signal generating means, for receiving a start signal and in response, to said start signal, providing the leading edge of a control gate signal and further for receiving said first stop signal and said first address signal for providing a first trailing edge signal for said control gate signal and alternatively for receiving said second stop signal and said second address signal for providing a second trailing-edge signal for said control gate signal.

2. A timing circuit according to claim 1 wherein said start and stop signal generating means includes a counter device with a plurality of stages.

3. A timing circuit according to claim 2 wherein said counter has a first stage with an output means for providing said start signal and has an $X^{th}$ stage with an output means for providing said first stop signal and has an $(X+N)^{th}$ stage with an output means for providing said second stop signal.

4. A timing circuit according to claim 3 wherein said logic circuit includes a two state circuit having first and second output means whereby in response to said start signal said two state circuit provides said leading edge of said control gate signal and in response respectively to said first stop signal and said second stop signal said two state circuit provides respectively said first and second trailing edges of said control gate signals.

5. A timing circuit according to claim 1 wherein said logic circuitry includes at least first and second gate circuitry and wherein said first gate circuitry is connected to receive said first stop signal and said first address signal to provide a first trailing edge signal and wherein said second gate circuitry is connected to receive said second stop signal and said second address signal to provide a second trailing edge signal.

6. A timing circuit according to claim 4 wherein said two state circuit is a bistable multivibrator.

7. A timing circuit according to claim 5 wherein said first and second gate circuitry are connected to further logic circuits and wherein there is included reset circuitry connected between said further logic circuits and said start and stop signal generating means to reset said start and stop signal generating means in response to an output signal from any of said first and second gate circuitry.

8. A timing circuit according to claim 7 wherein said further logic circuits perform an OR function and wherein there is further included in said logic circuitry a two state circuit which is connected in one state to receive the output of said further logic circuits to provide, alternatively, said first and second trailing edges of said control gate signal.

9. A timing circuit according to claim 8 wherein, in the other state, said two state circuit is connected to receive said start signal for providing the trailing edge of a control gate signal.

10. A timing circuit according to claim 9 wherein said start and stop signal generating means comprises a multi stage counter.

* * * * *